(12) United States Patent
Han

(10) Patent No.: US 12,744,094 B2
(45) Date of Patent: Sep. 22, 2026

(54) SEMICONDUCTOR MEMORY DEVICE AND OPERATING METHOD OF THE SEMICONDUCTOR MEMORY DEVICE

(71) Applicant: SK hynix Inc., Icheon-si (KR)

(72) Inventor: Yong Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 142 days.

(21) Appl. No.: 18/782,277

(22) Filed: Jul. 24, 2024

(65) Prior Publication Data

US 2025/0322893 A1 Oct. 16, 2025

(30) Foreign Application Priority Data

Apr. 12, 2024 (KR) ........................ 10-2024-0049436

(51) Int. Cl.
*G11C 16/34* (2006.01)
*G11C 16/08* (2006.01)
*G11C 16/10* (2006.01)

(52) U.S. Cl.
CPC .......... *G11C 16/3459* (2013.01); *G11C 16/08* (2013.01); *G11C 16/102* (2013.01)

(58) Field of Classification Search
CPC .... G11C 16/3459; G11C 16/08; G11C 16/102
See application file for complete search history.

(56) References Cited

U.S. PATENT DOCUMENTS

2021/0134377 A1* 5/2021 Papandreou ........... G11C 29/52
2024/0061583 A1* 2/2024 Zhou ..................... G06F 3/0629
2024/0071514 A1* 2/2024 Papagianni ........ G11C 16/0483

FOREIGN PATENT DOCUMENTS

KR 102251815 B1 5/2021
KR 1020210114718 A 9/2021
KR 1020230074890 A 5/2023

* cited by examiner

*Primary Examiner* — Min Huang
(74) *Attorney, Agent, or Firm* — WILLIAM PARK AND ASSOCIATES LTD.

(57) ABSTRACT

There are provided a semiconductor memory device and an operating method of the semiconductor memory device. The semiconductor memory device includes a memory cell array including a plurality of memory blocks and control logic for controlling an operation of the memory cell array. The control logic sets a target level of a program verify operation, based on offset information corresponding to a word line group or a memory string group, which corresponds to memory cells to be programmed in a program operation of a selected memory block among the plurality of memory blocks.

12 Claims, 10 Drawing Sheets

FIG. 2

SEMICONDUCTOR MEMORY DEVICE AND OPERATING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2024-0049436 filed on Apr. 12, 2024, in the Korean Intellectual Property Office, the entire contents of which application is incorporated herein by reference.

BACKGROUND

1. Technical Field

The present disclosure generally relates to an electronic device, and more particularly, to a semiconductor memory device and an operating method of the semiconductor memory device.

2. Related Art

A semiconductor memory device among semiconductor devices is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

A flash memory device may be classified into a two-dimensional semiconductor memory device in which a cell string is formed horizontally to a semiconductor substrate and a three-dimensional semiconductor memory device in which a cell string is formed vertically to a semiconductor substrate. The three-dimensional semiconductor memory device is a semiconductor memory device devised to overcome the limit of degree of integration of the two-dimensional semiconductor memory device, and includes a plurality of cell strings formed vertically stacked above a semiconductor substrate. The cell strings include a drain select transistor, memory cells, and a source select transistor, which are connected in series between a bit line and a common source line.

SUMMARY

In accordance with an embodiment of the present disclosure, there is provided a semiconductor memory device including: a memory cell array including a plurality of memory blocks; and a control logic configured to control an operation of the memory cell array, wherein the control logic sets a target level of a program verify operation, based on offset information corresponding to a word line group or a memory string group, which corresponds to memory cells to be programmed in a program operation of a selected memory block among the plurality of memory blocks.

In accordance with an embodiment of the present disclosure, there is provided a semiconductor memory device including: a memory cell array including a plurality of memory blocks; a peripheral circuit configured to perform a program operation on a selected memory block among the plurality of memory blocks; a group information storage unit configured to store group information; and a control logic configured to control the peripheral circuit to perform the program operation, wherein the control logic sets a target level of a program verify operation in the program operation, based on the group information.

In accordance with an embodiment of the present disclosure, there is provided a method of operating a semiconductor memory device, the method including: receiving a program command, an address, and program data with the semiconductor memory device; setting a target level of each of program states of a selected page of a selected memory block including memory cells to be programmed by checking group information corresponding to the address among group information stored in a group information storage unit; performing a program voltage apply operation on the selected page; and performing a program verify operation on the selected page, using the target level.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 2 is a diagram illustrating an embodiment of three-dimensionally configured memory blocks.

DETAILED DESCRIPTION

The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms. The embodiments are provided by way of example only.

Various embodiments provide a semiconductor memory device having improved operational characteristics by offsetting a characteristic change of a memory block, a word line group or a memory string group.

Figure 1:
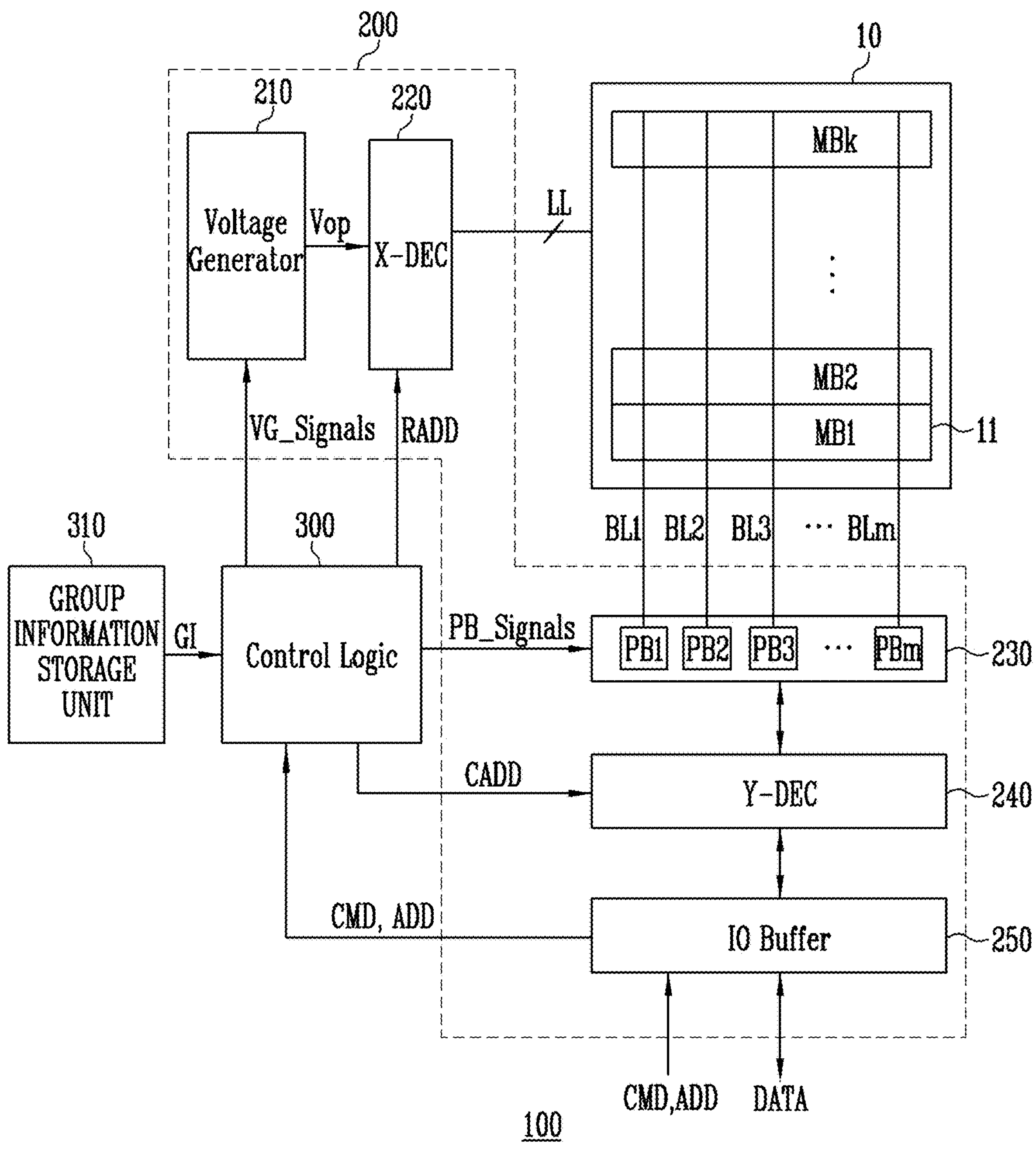
FIG. 1 is a block diagram illustrating a semiconductor memory system in accordance with an embodiment of the present disclosure.

FIG. 1 is a block diagram illustrating a semiconductor memory system in accordance with an embodiment of the present disclosure.

Referring to FIG. 1, the semiconductor memory device 100 may be configured to include a memory cell array 10, a voltage generator 210, an X decoder (X-DEC) 220, a read & write circuit 230, a Y decoder (Y-DEC) 240, an input/output (IO) buffer 250, a control logic 300, and a group information storage unit 310. The voltage generator 210, the X-DEC 220, the read & write circuit 230, the Y-DEC 240, and an IO buffer 250 may be defined as a peripheral circuit 200 which performs a program operation, a read operation, and an erase operation on the memory cell array 10. The control logic 130 may be implemented as hardware, software, or a combination of hardware and software. For example, the control logic 130 may be a control logic circuit operating in accordance with an algorithm and/or a processor executing control logic code. The group information storage unit 310 may be implemented as hardware, software, or a combination of hardware and software. For example, the group information storage unit 310 may be a group information storage circuit operating in accordance with an algorithm and/or a processor executing the group information storage code.

The memory cell array 10 may include a plurality of memory blocks MB1 to MBk. The plurality of memory blocks MB1 to MBk may be connected to the X-DEC 220 through local lines LL. The plurality of memory blocks MB1 to MBk may be connected to the read & write circuit 230 through bit lines BL1 to BLm. Each of the plurality of memory blocks MB1 to MBk may include a plurality of memory cells. In an embodiment, the plurality of memory cells may be nonvolatile memory cells.

Each of the plurality of memory blocks MB1 to MBk of the memory cell array 10 may include a plurality of memory strings. Each of the plurality of memory strings may include a drain select transistor, a plurality of memory cells, and a source select transistor, which are connected in series between a bit line and a source line. Also, each of the plurality of memory strings may include pass transistors respectively between the source select transistor and the memory cells and between the drain select transistor and the memory cells. The memory cell array 10 will be described later.

The voltage generator 210 may generate a plurality of operating voltages Vop in response to voltage generation control signals VG_Signals output from the control logic 300. For example, the voltage generator 210 may generate a program voltage and a pass voltage in a program operation, and generate a read voltage and a pass voltage in a read operation.

The X-DEC 220 may apply the plurality of operating voltages Vop generated by the voltage generator 210 to local lines LL connected to a selected memory block among the plurality of memory blocks MB1 to MBk included in the memory cell array 10 in response to a row address RADD output from the control logic 300. For example, the X-DEC 220 may apply the program voltage generated by the voltage generator 210 in the program operation to a selected word line among the local lines LL connected to the selected memory block, and apply the pass voltage generated by the voltage generator 210 to unselected word line among the local lines LL connected to the selected memory block. Also, the X-DEC 220 may apply the read voltage generated by the voltage generator 210 in the read operation, to a selected word line among the local lines LL connected to the selected memory block, and apply the pass voltage generated by the voltage generator 210 to unselected word line among the local lines LL connected to the selected memory block.

The read & write circuit 230 may include a plurality of page buffers PB1 to PBm. The plurality of page buffers PB1 to PBm may be connected to the memory cell array 10 through the bit lines BL1 to BLm. In a program operation, each of the plurality of page buffers PB1 to PBm may temporarily store data DATA to be programmed, which is received through the IO buffer 250 and the Y-DEC 240, and adjust a potential level of the bit lines BL1 to BLm, based on the temporarily stored data DATA. For example, each of the plurality of page buffers PB1 to PBm may apply a program inhibit voltage (e.g., Vcc) to a corresponding bit line when the data DATA to be programmed is "1," and apply a program allow voltage (i.e., a voltage lower than Vcc, e.g., 0V) to a corresponding bit line when the data DATA to be programmed is "0." Also, in a read operation, each of the plurality of page buffers PB1 to PBm may precharge the bit lines BL1 to BLm to a set level, and then perform the read operation by sensing a potential level or a current amount of the bit lines BL1 to BLm when the read voltage is applied to the selected memory block.

The read & write circuit 230 may be controlled in response to page buffer control signals PB_Signals generated by the control logic 300.

The IO buffer 250 may receive a command CMD and an address ADD from an outside and transmit the command CMD and the address ADD to the control logic 300. In a program operation, the IO buffer 250 may transmit data DATA to be programmed, which is received from the outside. Also, in a read operation, the IO buffer 250 may receive data DATA read from the Y-DEC 240 and output the data DATA to the outside. In an embodiment, the outside may be outside the semiconductor memory device and in other embodiments the outside may be outside the IO buffer 250.

The Y-DEC 240 may transmit data DATA to be programmed, which is received from the IO buffer 250 in a program operation, to the read & write circuit 230, and transmit data DATA read from the read & write circuit 230 in a read operation to the IO buffer 250, in response to a column address CADD received from the control logic 300.

The control logic 300 may be connected to the voltage generator 210, the X-DEC 220, the read & write circuit 230, the Y-DEC 240, and the IO buffer 250. The control logic 300 may be configured to control a general operation of the semiconductor memory device 100 in response to the command CMD received from the IO buffer 250. For example, the control logic 300 may receive a command CMD corresponding to a program operation, a read operation, or an erase operation, and control the peripheral circuit 200 to perform the program operation, the read operation, or an erase operation in response to the received command CMD. That is, the control logic 300 may receive a command CMD and an address ADD, generate and output the voltage generation control signals VG_Signals and the page buffer control signals PB_Signals in response to the received command CMD, and generate the row address RADD and the column address CADD, based on the received address ADD, and then output the generated row address RADD and the generated column address CADD to the X-DEC 220 and the Y-DEC 240.

In a program operation, the control logic 300 may receive, from the group information storage unit 310, group information GI corresponding to a target memory block, target pages, and target memory strings, which are to be programmed. For example, the group information GI may include first offset information corresponding to a memory group including the target memory block, second offset information corresponding to a word line group including the target pages, and third offset information corresponding to a memory string group including the target memory strings.

The control logic 300 may set a target threshold voltage value by increasing or decreasing the target threshold voltage value from a reference value in a program verify operation of the program operation, based on the first offset information, the second offset information, and the third offset information.

The group information storage unit 310 may divide the plurality of memory blocks MB1 to MBk included in the memory cell array 10 into a plurality of memory block groups, and store first offset information corresponding to each memory block group. Each of the plurality of memory block groups may include at least one memory block. Also, the group information storage unit 310 may divide a plurality of word lines included in one memory block into a plurality of word line groups, and store second offset information corresponding to each word line group. Also, the group information storage unit 310 may divide a plurality of memory strings included in one memory block into a plurality of memory string groups, and store third offset information corresponding to each memory string group.

First offset information of the memory block groups, which are stored in the group information storage unit 310, second offset information of the word line groups, which are stored in the group information storage unit 310, and third offset information of the memory string groups, which are stored in the group information storage unit 310, may be stored in at least one memory block defined as a system block or a content addressable memory (CAM) block among the plurality of memory blocks MB1 to MBk, and the first offset information, the second offset information, and the third offset information, which are stored in the system block or the CAM block in a power-on operation of the semiconductor memory device 100, may be read to be stored in the group information storage unit 310.

In the embodiment of the present disclosure, it is illustrated and described that the group information storage unit 310 is disposed outside the control logic 300. However, the group information storage unit 310 may be configured to be included in the control logic 300.

Figure 2:
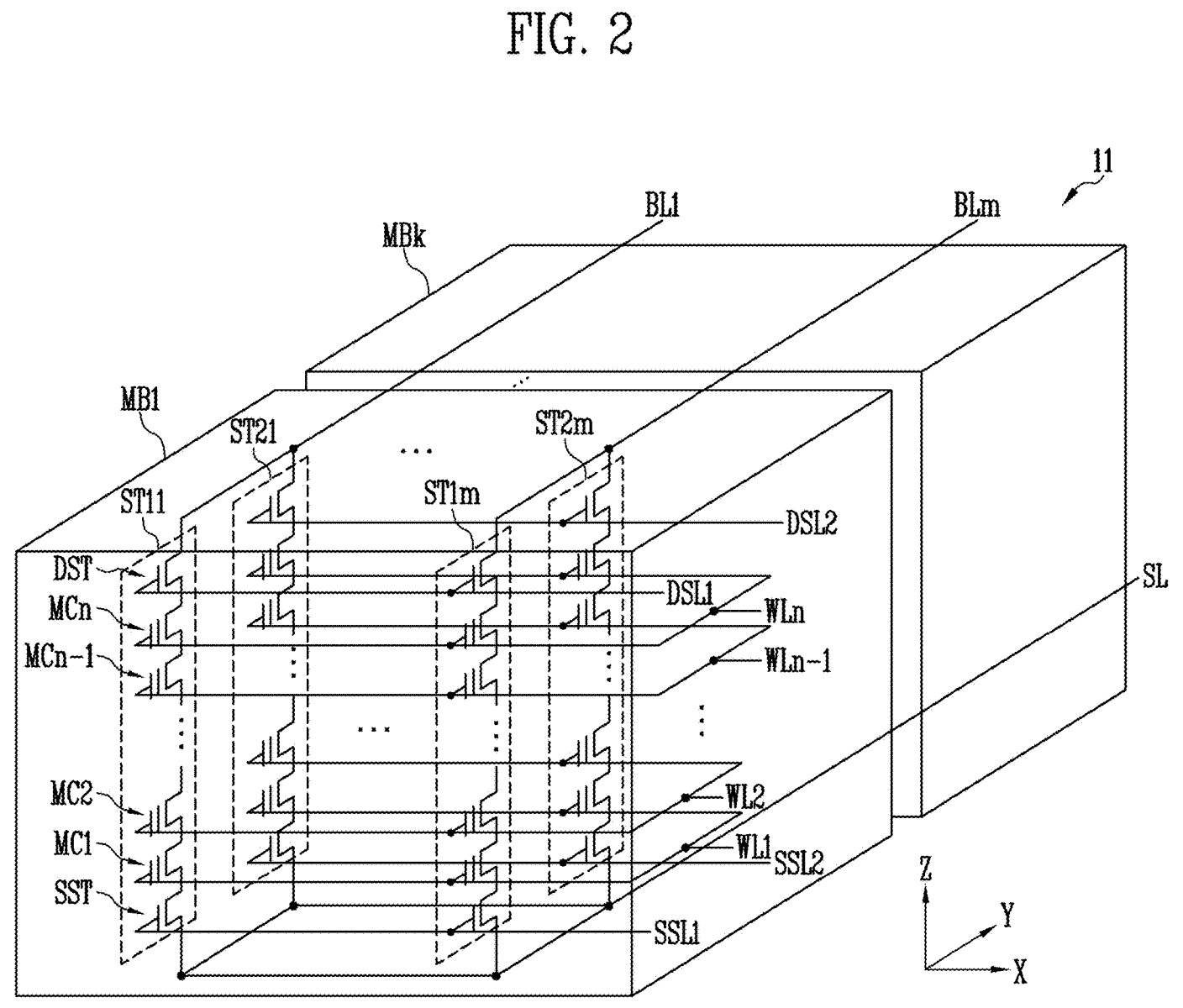

FIG. 2 is a diagram illustrating an embodiment of three-dimensionally configured memory blocks.

Referring to FIG. 2, the memory cell array 10 may include a plurality of memory blocks MB1 to MBk. Each of the plurality of memory blocks MB1 to MBk may include a plurality of strings ST11 to ST1m and ST21 to ST2m. In an embodiment, each of the plurality of strings ST11 to ST1m and ST21 to ST2m may be formed in an 'I' shape or a 'U' shape. In a first memory block MB1, m strings may be arranged in a row direction (X direction). Although a case where two strings are arranged in a column direction (Y direction) is illustrated in FIG. 2, this is for convenience of description, and three or more strings may be arranged in the column direction (Y direction).

Each of the plurality of strings ST11 to ST1m and ST21 to ST2m may include at least one source select transistor SST, first to nth memory cells MC1 to MCn, and at least one drain select transistor DST.

The source select transistor SST of each string may be connected between a source line SL and memory cells MC1 to MCn. Source select transistors of strings arranged on the same row may be connected to the same source select line. Source select transistors of strings ST11 to ST1m arranged on a first row may be connected to a first source select line SSL1. Source select transistors of strings ST21 to ST2m arranged on a second row may be connected to a second source select line SSL2. In another embodiment, the source select transistors of the strings ST11 to ST1m and ST21 to ST2m may be commonly connected to one source select line.

The first to nth memory cells MC1 to MCn of each string may be connected in series to each other between the source select transistor SST and the drain select transistor DST. Gates of the first to nth memory cells MC1 to MCn may be respectively connected to first to nth word lines WL1 to WLn.

In an embodiment, at least one of the first to nth memory cells MC1 to MCn may be used as a dummy memory cell. When the dummy memory cell is provided, a voltage or current of a corresponding string can be controlled. Accordingly, in an embodiment, the reliability of data stored in the memory block 110 can be improved.

The drain select transistor DST of each string may be connected between a bit line and the memory cells MC1 to MCn. Drain select transistors DST of strings arranged in the row direction may be connected to a drain select line extending in the row direction. Drain select transistors DST of the strings ST11 to ST1m on the first row may be connected to a first drain select line DSL1. Drain select transistors DST of the strings ST21 to ST2m on the second row may be connected to a second drain select line DSL2.

Figure 3:
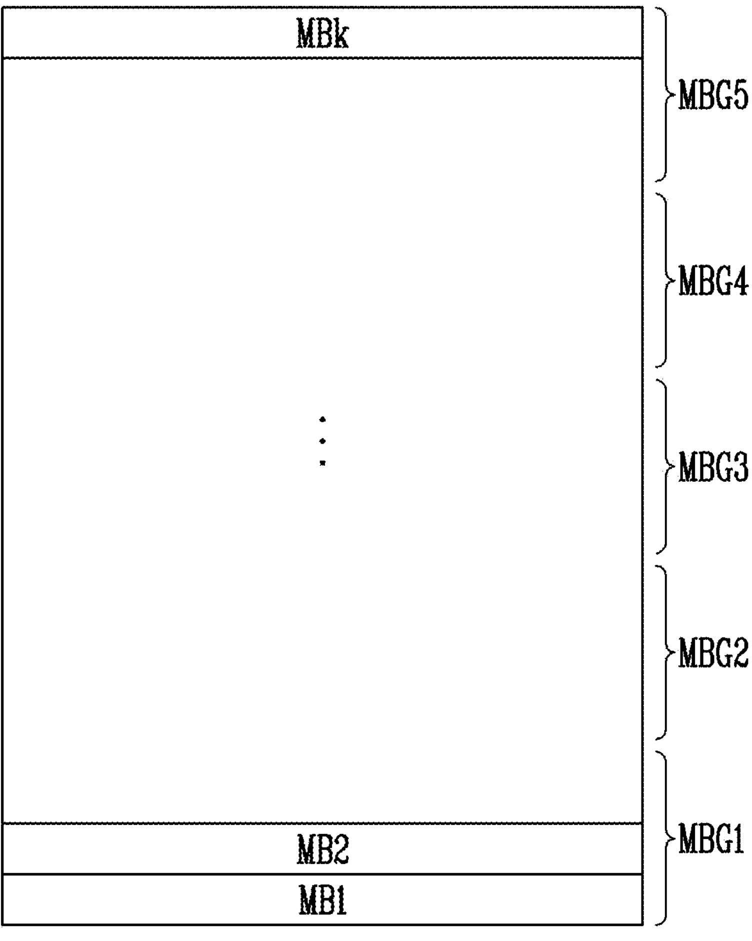
FIG. 3 is a diagram illustrating grouping of memory blocks in accordance with an embodiment of the present disclosure.

FIG. 3 is a diagram illustrating grouping of memory blocks in accordance with an embodiment of the present disclosure.

Referring to FIG. 3, a memory cell array 10 including a plurality of memory blocks MB1 to MBk is illustrated. The memory blocks MB1 to MBk may be sequentially disposed from a first memory block MB1 to a kth memory block MBk. According to a semiconductor memory device in accordance with an embodiment of the present disclosure, the plurality of memory blocks MB1 to MBk may be grouped into five memory block groups of first memory block group MBG1 to a fifth memory block group MBG5. However, the present disclosure is not limited thereto, and the plurality of memory blocks MB1 to MBk may be grouped into at least two memory block groups. Two or more memory blocks included in one memory block group may be disposed at positions physically adjacent to each other. Memory blocks disposed relatively close to each other while being physically adjacent to each other may have similar operational characteristics according to a manufacturing process characteristic, and memory blocks disposed relatively distant from each other may have different operational characteristics according to a manufacturing process characteristic. In addition, operational characteristics of memory blocks may be different from each other according to a distance from the voltage generator 210 shown in FIG. 1, which supplies an operating voltage to the memory blocks.

Figure 4:
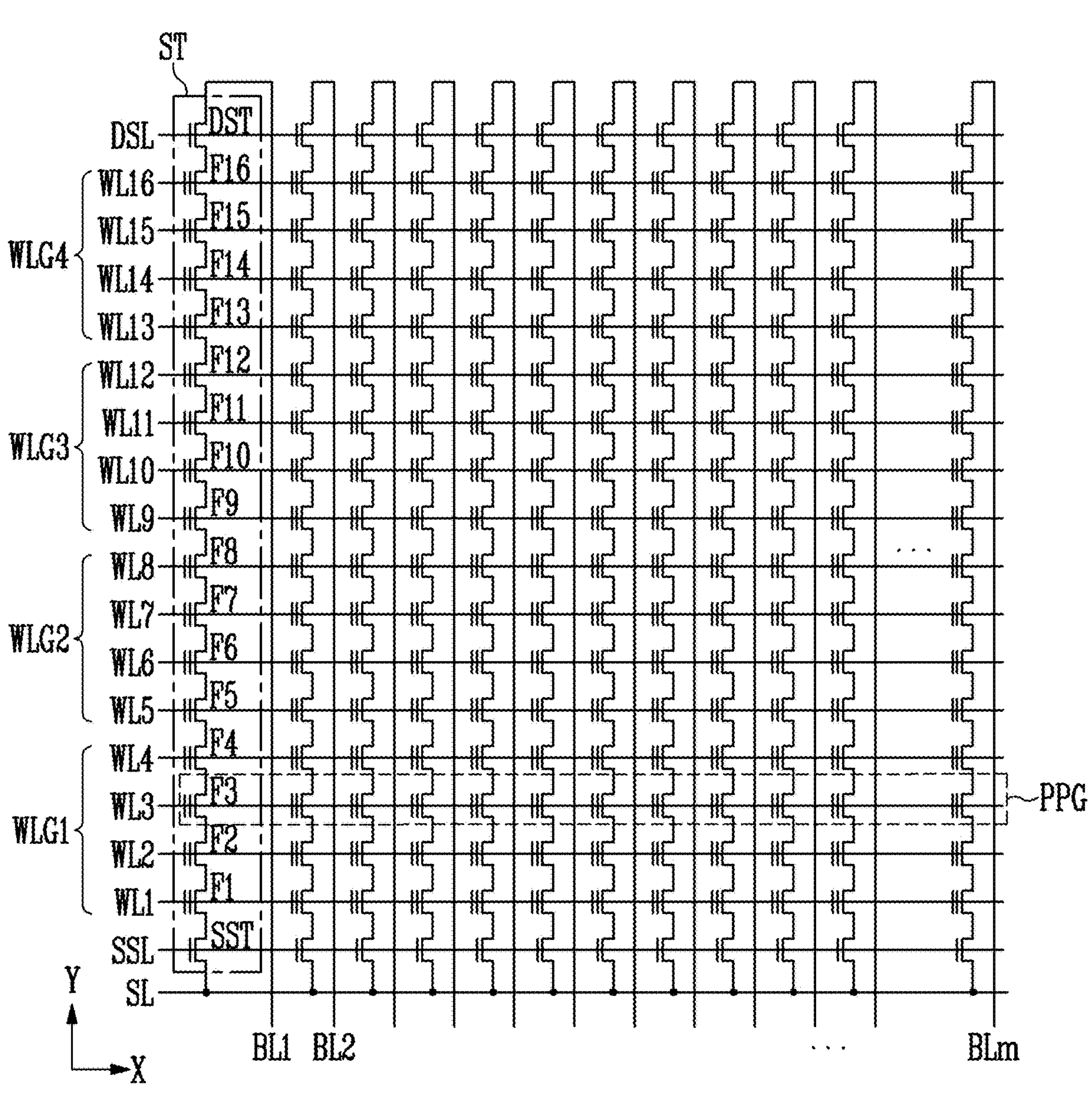
FIG. 4 is a diagram illustrating grouping of word lines in accordance with an embodiment of the present disclosure.

FIG. 4 is a diagram illustrating grouping of word lines in accordance with an embodiment of the present disclosure. A plurality of memory blocks may have similar structures. For convenience of description, a first memory block MB1 will be described as an example.

Referring to FIG. 4, in the first memory block MB1, a plurality of word lines arranged in parallel to one another may be connected between a first select line and a second select line. The first select line may be a source select line SSL, and the second select line may be a drain select line DSL. More specifically, the first memory block MB1 may include a plurality of memory strings ST connected between bit lines BL1 to BLm and a source line SL. The bit lines BL1 to BLm may be connected to the memory strings ST, respectively, and the source line SL may be commonly connected to the memory strings ST. The memory strings ST may be configured identically to one another, and therefore, a memory string ST connected to a first bit line BL1 will be described as an example.

The memory string ST may include a source select transistor SST, a plurality of memory cells F1 to F16, and a drain select transistor DST, which are connected in series between the source line SL and the first bit line BL1. At least one source select transistor SST and at least one drain select transistor DST may be included in one memory string ST, and memory cells of which number is greater than that of the memory cells F1 to F16 shown in the drawing may be included in the one memory string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different memory strings ST may be connected to the source select line SSL, gates of drain select transistors DST included in different memory strings ST may be connected to the drain select line DSL, and gates of memory cells F1 to F16 included in different memory strings ST may be connected to a plurality of word lines WL1 to WL16. A group of memory cells connected to the same word line among memory cells included in different memory strings ST may be referred as a physical page PPG. Therefore, physical pages PPG of which number corresponds to that of the word lines WL1 to WL16 may be included in the first memory block MB1.

The plurality of word lines WL1 to WL16 connected to the plurality of memory cells F1 to F16 included in the above-described first memory block MB1 may be grouped into a plurality of word line groups WLG1 to WLG4. In accordance with an embodiment of the present disclosure, the plurality of word lines WL1 to WL16 may be grouped into four word line groups of a first word line group WLG1 to a fourth word line group WLG4. However, the present disclosure is not limited thereto, and the plurality of word lines WL1 to WL16 may be grouped into two or more word line groups. That is, a plurality of physical pages PPG corresponding to the plurality of word lines WL1 to WL16 may be divided into at least two groups. The plurality of physical pages PPG may have different operational characteristics according to arrangement positions. For example, physical pages adjacent to select transistors and the other physical pages may have different operational characteristics according to a coupling phenomenon caused by a select transistor.

Figure 5:
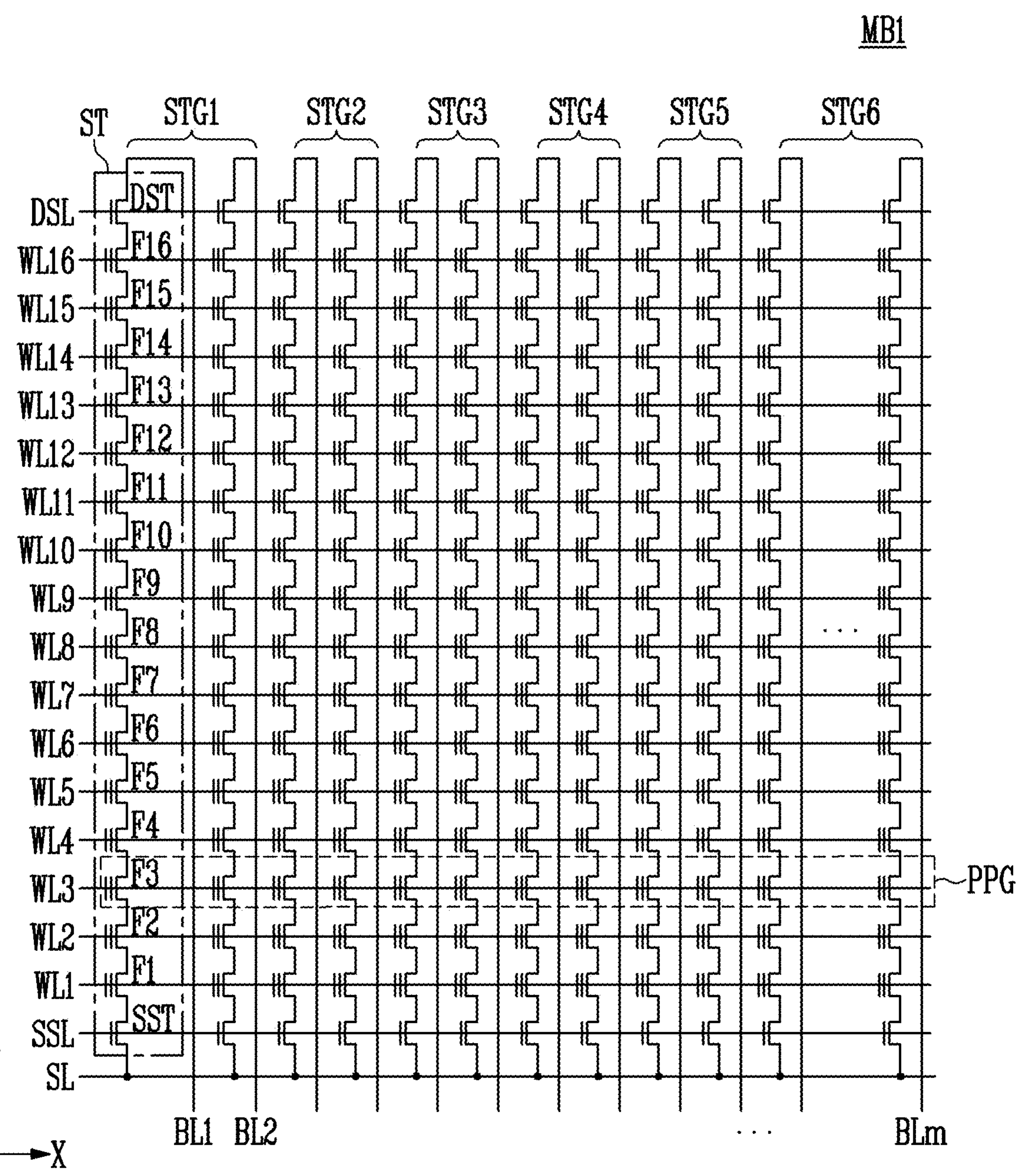
FIG. 5 is a diagram illustrating grouping of memory strings in accordance with an embodiment of the present disclosure.

FIG. 5 is a diagram illustrating grouping of memory strings in accordance with an embodiment of the present disclosure. A plurality of memory blocks may have similar structures. For convenience of description, a first memory block MB1 will be described as an example.

As described above with reference to FIG. 4, in the first memory block MB1, a plurality of bit lines BL1 to BLm may correspond to a plurality of memory strings ST, respectively. The plurality of memory strings ST may be grouped into a plurality of memory string groups STG1 to STG6. In accordance with an embodiment of the present disclosure, the plurality of memory strings ST may be grouped into six memory string groups of a first memory string group STG1 to a sixth memory string group STG6. However, the present disclosure is not limited thereto, and the plurality of memory strings ST may be grouped into at least two memory string groups. The plurality of memory strings ST may have different operational characteristics according to arrangement positions. For example, memory strings disposed adjacent to each other at an outer portion in an area in which a memory block is disposed and memory strings disposed at an inner portion in the area in which the memory block is disposed may have different operational characteristics.

Figure 6:
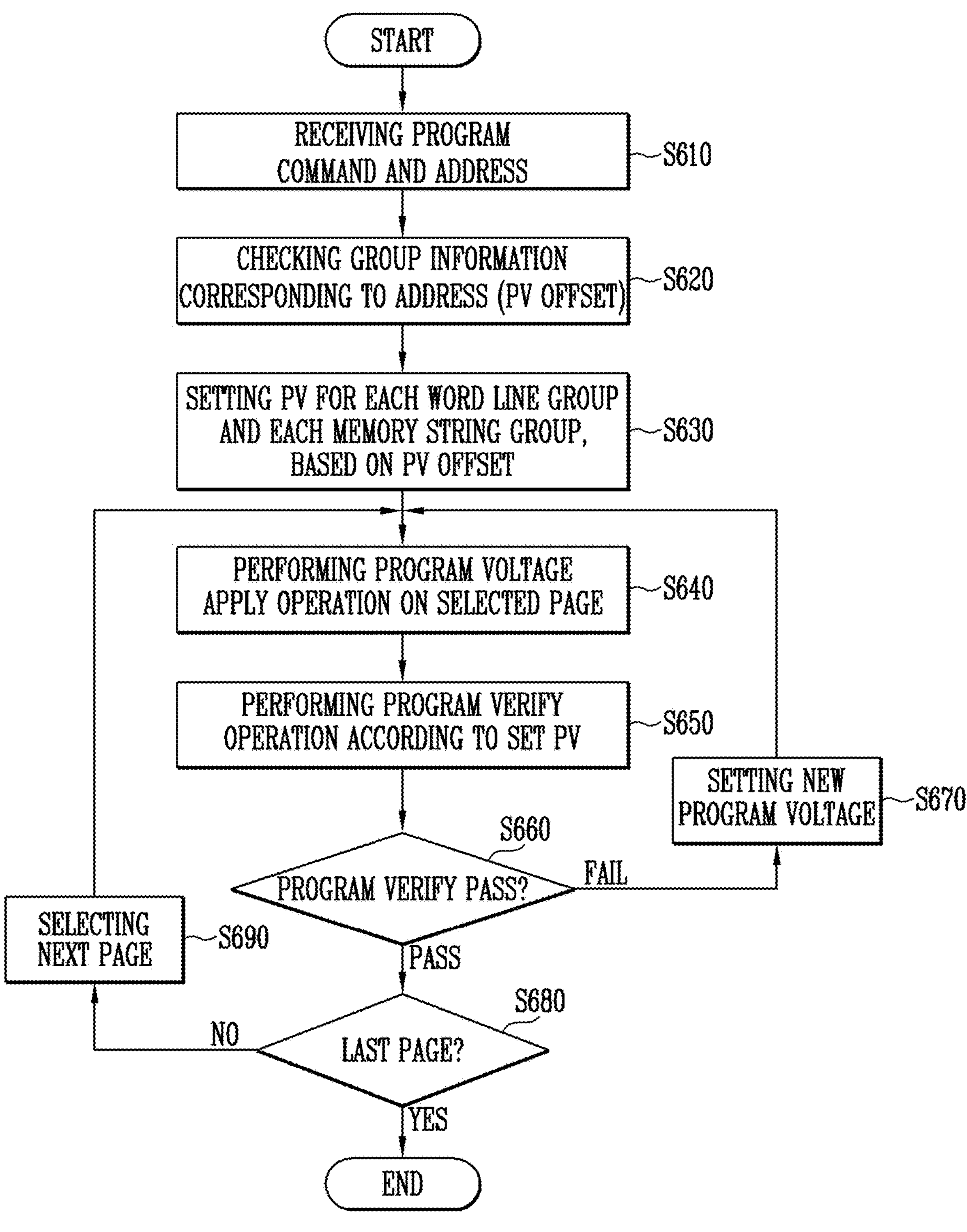
FIG. 6 is a flowchart illustrating a program operation of the semiconductor memory device in accordance with an embodiment of the present disclosure.

FIG. 6 is a flowchart illustrating a program operation of the semiconductor memory device in accordance with an embodiment of the present disclosure.

Figure 7:
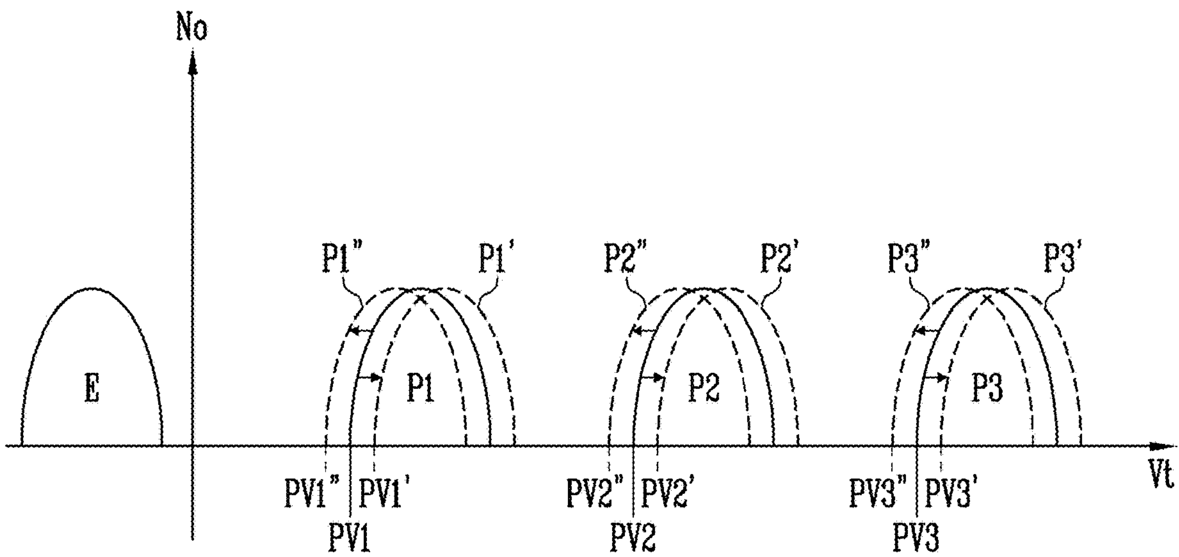
FIG. 7 is a threshold voltage distribution diagram illustrating a program operation of the semiconductor memory device in accordance with an embodiment of the present disclosure.

FIG. 7 is a threshold voltage distribution diagram illustrating a program operation of the semiconductor memory device in accordance with an embodiment of the present disclosure.

A program operation of the semiconductor memory device in accordance with an embodiment of the present disclosure will be described as follows with reference to FIGS. 1 to 7.

In step S610, a command CMD corresponding to the program operation and an address ADD corresponding to memory cells on which the program operation is to be performed may be received to the semiconductor memory device 100 from an external device, e.g., a controller which controls the semiconductor memory device 100. In addition, data DATA to be programmed may also be received to the semiconductor memory device 100 from the external device.

The semiconductor memory device 100 may select one of the plurality of memory blocks MB1 to MBk included in the memory cell array 10.

In step S620, the control logic 300 may receive group information GI on memory cells to be programmed from the group information storage unit 310 and check the received group information GI. For example, the control logic 300 may read a programming verify level (PV) offset of the memory cells to be programmed, which is stored in the group information storage unit 310.

In step S630, the control logic 300 may set target levels PV1, PV2, and PV3 of the memory cells to be programmed in a program verify operation, based on the read PV offset, and reset the target levels PV1, PV2, and PV3 by maintaining, increasing or decreasing the target levels PV1, PV2, and PV3 for each word line group or memory string group of the memory cells to be programmed.

For example, the control logic 300 may reset a target level PV1 corresponding to a first program state P1 by maintaining the target level PV1, increasing the target level PV1 to PV1', or decreasing the target level PV1 to PV1", based on the PV offset. For example, the control logic 300 may reset a target level PV2 corresponding to a second program state P2 by maintaining the target level PV2, increasing the target level PV2 to PV2', or decreasing the target level PV2 to PV2", based on the PV offset. For example, the control logic 300 may reset a target level PV3 corresponding to a third program state P3 by maintaining the target level PV3, increasing the target level PV3 to PV3', or decreasing the target level PV3 to PV3", based on the PV offset.

The PV offset may include first offset information of a memory block group including a memory block including the memory cells to be programmed, second offset information corresponding to a word line group including the memory cells to be programmed, and third offset information corresponding to a memory string group including the memory cells to be programmed. The first offset information may vary for each of the plurality of memory block groups MBG1 to MBG5, the second offset information may vary for each of the plurality of word line groups WLG1 to WLG4, and the third offset information may vary for each of the plurality of memory string groups STG1 to STG6.

In step S640, a program voltage apply operation on a selected page may be performed. For example, a program voltage apply operation on a first physical page selected among a plurality of physical pages to be programmed may be performed.

The plurality of page buffers PB1 to PBm of the read & write circuit 230 may temporarily store the received data DATA in response to the page buffer control signals PB_Signals, and apply a program inhibit voltage (Vcc) or a program allow voltage to corresponding bit lines BL1 to BLm according to the received data DATA.

The voltage generator 210 may generate and output a program voltage and a pass voltage in response to the voltage generation control signals VG_Signals. The X-DEC 220 may apply the program voltage generated by the voltage generator 210 to a selected word line corresponding to the selected page and apply the pass voltage generated by the voltage generator 210 to unselected word lines in response to a row address RADD in the received address ADD.

In step S650, the program verify operation may be performed based on the set target levels PV.

The voltage generator 210 may generate and output a program verify voltage and a pass voltage in response to the voltage generation control signals VG_Signals. The X-DEC 220 may apply the program verify voltage generated by the voltage generator 210 to the selected word line and apply the pass voltage generated by the voltage generator 210 to the unselected word lines in response to the row address RADD.

The plurality of page buffers PB1 to PBm of the read & write circuit 230 may sense a potential level or a current amount of corresponding bit lines BL1 to BLm, and generate a pass or fail result of the program verify operation, based on a sensing result and the stored data DATA to be programmed.

In step S660, the control logic 300 may determine whether the program verify operation has passed (program verify pass), based on the pass or fail result of the program verify operation, which is generated by the read & write circuit 230.

When it is determined that the program verify operation has failed as a result of the step S660 (FAIL), in step S670, the control logic 300 may set a new program voltage. The new program voltage may be a voltage of which potential is increased by a setting value as compared with the just previously used program voltage. After that, the above-described steps may be re-performed from the step S640.

When it is determined that the program verify operation has passed as a result of the step S660 (PASS), in step S680, it may be checked whether the selected page on which the program voltage apply operation and the program verify operation are performed is a last page among the pages to be programmed.

When it is determined that the selected page is not the last page in the step S680 (NO), in step S690, a next page may be selected, the above-described steps may be re-performed from the step S640, and the program operation may be ended when it is determined that the selected page is the last page in the step S680 (YES).

When the memory cells programmed by the above-described program operation are programmed to the first program state P1, the second program state P2, and the third program state P3, the memory cells may be programmed to a first program state P1', a second program state P2', and a third program state P3', of which threshold voltage is increased, or be programmed to a first program state P1", a second program state P2", and a third program state P3", of which threshold voltage is decreased, according to a memory block group including a selected memory block, and a word line group and a memory string group, which include memory cells.

As described above, in accordance with an embodiment of the present disclosure, an offset value at a target level in the program operation can be adjusted according to a group including a selected memory block among the plurality of memory blocks included in the semiconductor memory device 100, a group including a selected page in the selected memory block, and a memory string group including the selected memory block.

Figure 8:
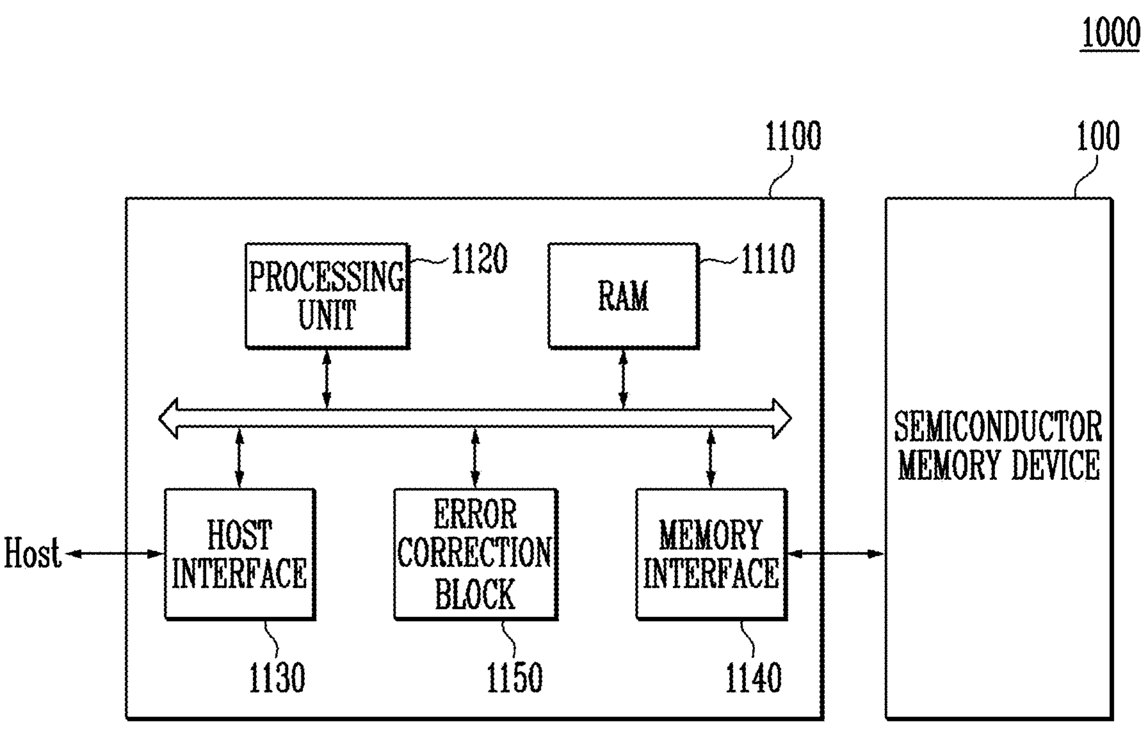
FIG. 8 is a block diagram illustrating an embodiment of a memory system including the semiconductor memory device shown in FIG. 1.

FIG. 8 is a block diagram illustrating an embodiment of a memory system including the semiconductor memory device shown in FIG. 1.

Referring to FIG. 8, the memory system 1000 may include a semiconductor memory device 100 and a controller 1100. The semiconductor memory device 100 may be the semiconductor memory device described with reference to FIG. 1. Hereinafter, overlapping descriptions will be omitted.

The controller 1100 may be connected to a host Host and the semiconductor memory device 100. The controller 1100 may be configured to access the semiconductor memory device 100 in response to a request from the host Host. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include Random Access Memory (RAM) 1110, a processing unit 1120, a host interface 1130, a memory interface 1140, and an error correction block 1150. The RAM 1110 may be used as at least one of a working memory of the processing unit 1120, a cache memory between the semiconductor memory device 100 and the host Host, and a buffer memory between the semiconductor memory device 100 and the host Host. The processing unit 1120 may control a general operation of the controller 1100. In addition, the controller 1100 may temporarily store program data provided from the host Host in a write operation.

The host interface 1130 may include a protocol for performing data exchange between the host Host and the controller 1100. In an embodiment, the controller 1100 may be configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface 1140 may include a NAND interface or a NOR interface.

The error correction block 1150 may be configured to detect and correct an error of data received from the semiconductor memory device 100, using an Error Correcting Code (ECC). The processing unit 1120 may adjust a read voltage according to an error detection result of the error correction block 1150, and control the semiconductor memory device 100 to perform re-reading. In an embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device, to constitute a memory card. For example, the controller 1100 and the semiconductor memory device 100 may be integrated into one semiconductor device to constitute a memory card such as a PC card (personal computer memory card international association (PCMCIA)), a compact flash (CF) card, a smart media card (SM or SMC), a memory stick, a multimedia card (MMC, RS-MMC, or MMCmicro), an SD card (SD, miniSD, microSD or SDHC), or universal flash storage (UFS).

The controller 1100 and the semiconductor memory device 100 may be integrated into one semiconductor device to form a semiconductor drive (Solid-State Drive (SSD)). The semiconductor drive (SSD) may include a storage device configured to store data in a semiconductor memory. When the memory system 1000 is used as the semiconductor drive (SSD), an operating speed of the host Host connected to the memory system 1000 may be remarkably increased.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or one of various components for constituting a computing system.

In an embodiment, the semiconductor memory device 100 or the memory system 1000 may be embedded in packages of various forms. For example, the semiconductor memory device 100 or the memory system 1000 may be embedded in packages such as a package on package (POP), ball grid arrays (BGAs), chip scale packages (CSPs), a Plastic Leaded Chip Carrier (PLCC), a Plastic Dual In Line Package (PDIP), a die in waffle pack, a die in wafer form, a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a System In Package (SIP), a Multi-Chip Package (MCP), a Wafer-level Fabricated Package (WFP), or a Wafer-level Processed Stack Package (WSP).

Figure 9:
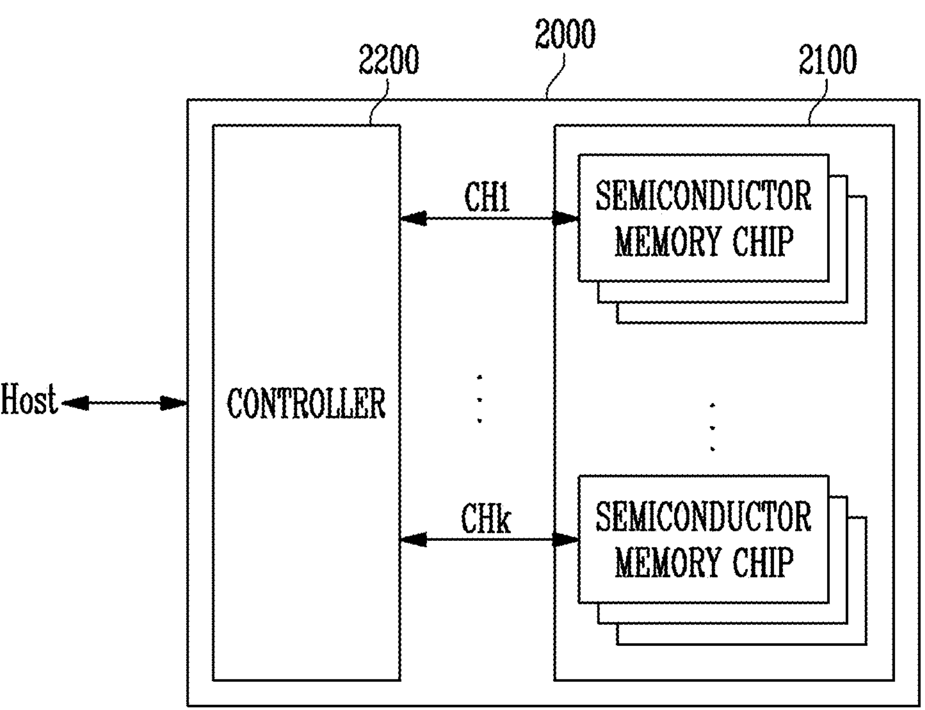
FIG. 9 is a block diagram illustrating an application example of the memory system shown in FIG. 8.

FIG. 9 is a block diagram illustrating an application example of the memory system shown in FIG. 8.

Referring to FIG. 9, a memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicate with the controller 2200 respectively through first to kth channels CH1 to CHk. Each semiconductor memory chip may be configured and operated identically to the semiconductor memory device 100 described above with reference to FIG. 1.

Each group may be configured to communicate with the controller 2200 through one common channel. The controller 2200 may be configured identically to the controller 1100 described with reference to FIG. 8, and be configured to control the plurality of memory chips of the semiconductor memory device 2100 through the plurality of first to kth channels CH1 to CHk.

Figure 10:
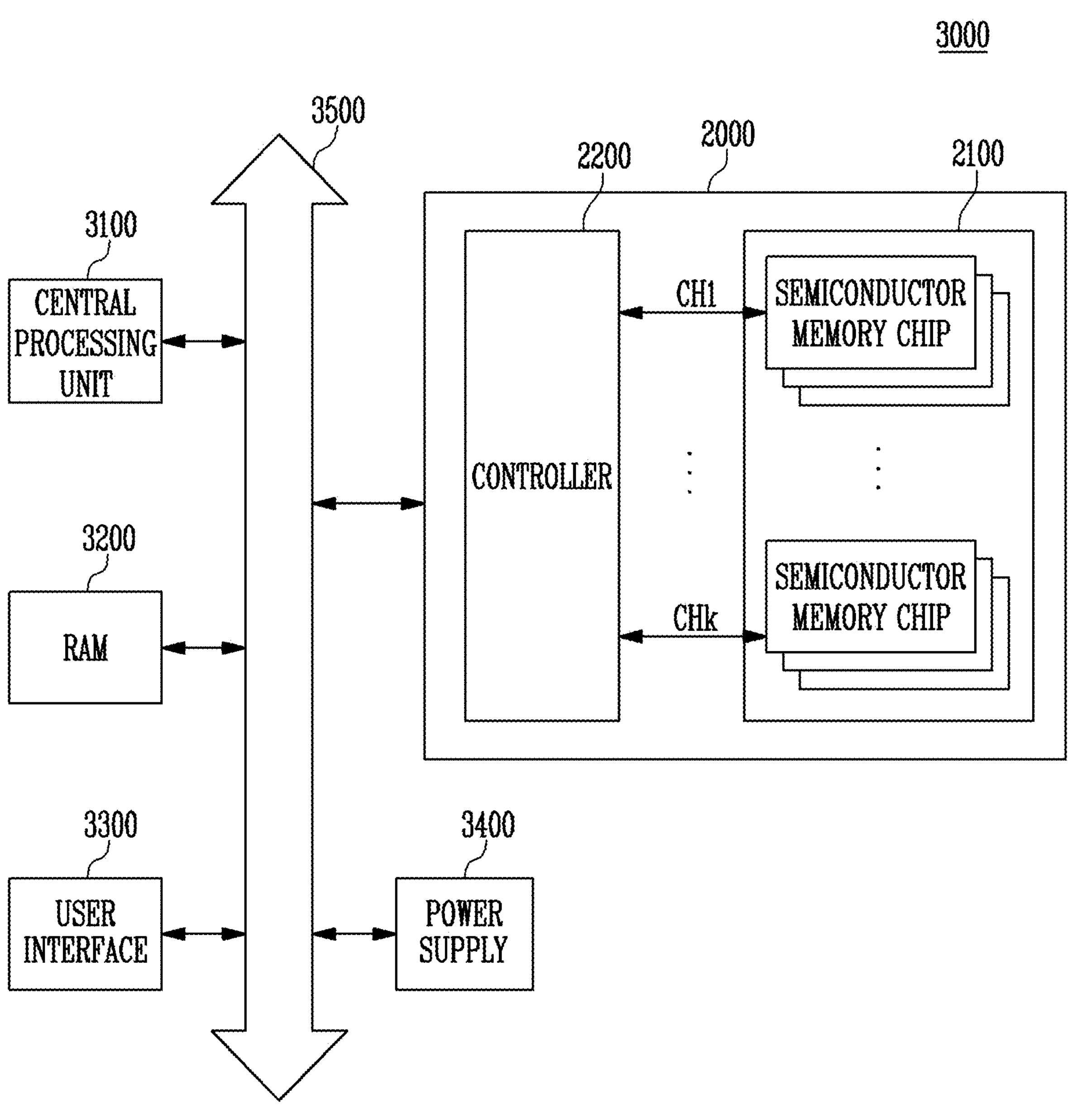
FIG. 10 is a block diagram illustrating an embodiment of a computing system including the memory system described with reference to FIG. 9.

FIG. 10 is a block diagram illustrating an embodiment of a computing system including the memory system described with reference to FIG. 9.

The computing system 3000 may include a central processing unit 3100, a Random Access Memory (RAM) 3200, a user interface 3300, a power supply 3400, a system bus 3500, and a memory system 2000.

The memory system 2000 may be electrically coupled to the central processing unit 3100, the RAM 3200, the user interface 3300, and the power supply 3400 through the system bus 3500. Data provided through the user interface 3300 or data processed by the central processing unit 3100 may be stored in the memory system 2000.

In FIG. 10, it is illustrated that the semiconductor memory device 2100 is connected to the system bus 3500 through the controller 2200. However, the semiconductor memory device 2100 may be configured to be directly connected to the system bus 3500. Functions of the controller 2200 may be performed by the central processing unit 3100 and the RAM 3200.

In FIG. 10, it is illustrated that the memory system 2000 described with reference to FIG. 9 is provided. However, the memory system 2000 may be replaced with the memory system 1000 described with reference to FIG. 8. In an embodiment, the computing system 3000 may include both the memory systems 1000 and 2000 described above with reference to FIGS. 8 and 9.

In accordance with an embodiment of the present disclosure, a target level in a program verify operation is adjusted according to a characteristic for each memory block group, each word line group or each memory string group, so that a characteristic change of memory blocks, word line groups or memory string groups can be offset, thereby improving operational characteristics of the semiconductor memory device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

The embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:

a memory cell array including a plurality of memory blocks;

a control logic configured to control an operation of the memory cell array; and a group information storage unit configured to output, to the control logic, first offset information corresponding to a memory block group including a selected memory block, second offset information corresponding to a page group including a page to be programmed, and third offset information corresponding to a memory string group including a memory string to be programmed, wherein the control logic sets a target level of a program verify operation, based on the first to third offset information.

2. The semiconductor memory device of claim 1, wherein the group information storage unit is configured to:

divide the plurality of memory blocks into a plurality of memory block groups and store the first offset information corresponding to each memory block group;

divide a plurality of word lines of each of the plurality of memory blocks into a plurality of word line groups and store the second offset information corresponding to each word line group; and divide a plurality of memory strings of each of the plurality of memory blocks into a plurality of memory string groups and store the third offset information corresponding to each memory string group.

3. The semiconductor memory device of claim 1, wherein the control logic sets the target level corresponding to a program state to be programmed in the program verify operation by maintaining, increasing, or decreasing the target level, based on the first offset information, the second offset information, and the third offset information.

4. The semiconductor memory device of claim 1, wherein the first offset information, the second offset information, and the third offset information, which are stored in the group information storage unit, are stored in at least one memory block defined as a system block or a content addressable memory (CAM) block among the plurality of memory blocks, and wherein the first offset information, the second offset information, and the third offset information, which are stored in the system block or the CAM block in a power-on operation, are read to be stored in the group information storage unit.

5. A semiconductor memory device comprising:

a memory cell array including a plurality of memory blocks;

a peripheral circuit configured to perform a program operation on a selected memory block among the plurality of memory blocks;

a control logic configured to control the peripheral circuit to perform the program operation; and a group information storage unit configured to provide the control logic with first offset information corresponding to a memory block group including a selected memory block, second offset information corresponding to a page group including a page to be programmed, and third offset information corresponding to a memory string group including a memory string to be programmed, wherein the control logic sets a target level of a program verify operation during the program operation, based on the first to third offset information.

6. The semiconductor memory device of claim 5, wherein the group information storage unit:

divides the plurality of memory blocks into a plurality of memory block groups and stores the first offset information corresponding to each memory block group;

divides a plurality of word lines of each of the plurality of memory blocks into a plurality of word line groups and stores the second offset information corresponding to each word line group; and divides a plurality of memory strings of each of the plurality of memory blocks into a plurality of memory string groups and stores the third offset information corresponding to each memory string group.

7. The semiconductor memory device of claim 5, wherein the control logic sets the target level corresponding to a program state to be programmed in the program verify operation by maintaining, increasing, or decreasing the target level, based on the first offset information, the second offset information, and the third offset information.

8. The semiconductor memory device of claim 5, wherein the first offset information, the second offset information, and the third offset information, which are stored in the group information storage unit, are stored in at least one memory block defined as a system block or a content addressable memory (CAM) block among the plurality of memory blocks, and wherein the first offset information, the second offset information, and the third offset information, which are stored in the system block or the CAM block in a power-on operation, are read to be stored in the group information storage unit.

9. A method of operating a semiconductor memory device, the method comprising:

receiving a program command, an address, and program data;

setting a target level of each of program states of a selected page of a selected memory block including memory cells to be programmed by checking group information corresponding to the address among group information stored in a group information storage unit;

performing a program voltage apply operation on the selected page; and performing a program verify operation on the selected page, using the target level, wherein the group information includes first offset information corresponding to a memory block group including the selected memory block, second offset information corresponding to a page group including the selected page, and third offset information corresponding to a memory string group including a memory string to be programmed.

10. The method of claim 9, wherein, in the setting of the target level, the target level corresponding to each of the program states is set by being increased or decreased, based on the first offset information, the second offset information, and the third offset information.

11. The method of claim 9, further comprising determining the program verify operation as a program pass when memory cells included in the selected page are programmed to the set target level or higher in the program verify operation.

12. The method of claim 11, further comprising selecting a next page of the selected page and re-performing the operations from the program voltage apply operation when the program verify operation is determined as the program pass.

* * * * *